United States Patent
Busser

(10) Patent No.: US 10,794,940 B2
(45) Date of Patent: Oct. 6, 2020

(54) SYSTEM FOR ACCURATELY DETERMINING AN AMOUNT OF ELECTRICAL CURRENT FLOWING THROUGH A HALL EFFECT CURRENT SENSOR

(71) Applicant: LG Chem, Ltd., Seoul (KR)

(72) Inventor: Robert D. Busser, West Bloomfield, MI (US)

(73) Assignee: LG Chem, Ltd., Seoul (KR)

( * ) Notice: Subject to any disclaimer, the term of this patent is extended or adjusted under 35 U.S.C. 154(b) by 290 days.

(21) Appl. No.: 16/024,975

(22) Filed: Jul. 2, 2018

(65) Prior Publication Data
US 2020/0003808 A1    Jan. 2, 2020

(51) Int. Cl.
G01R 19/25    (2006.01)
G01R 15/20    (2006.01)
G01R 31/00    (2006.01)

(52) U.S. Cl.
CPC ....... G01R 19/2513 (2013.01); G01R 15/202 (2013.01); G01R 31/007 (2013.01)

(58) Field of Classification Search
CPC    G01R 19/2506; G01R 31/007; G01R 15/202; G01R 19/2513
See application file for complete search history.

(56) References Cited

U.S. PATENT DOCUMENTS

| 9,910,121 B2 | 3/2018 | Hwang |
| 2015/0154145 A1 | 6/2015 | Watanabe et al. |
| 2016/0313403 A1* | 10/2016 | Hwang ................ G01R 35/00 |

FOREIGN PATENT DOCUMENTS

KR    20150023091 A    3/2015

* cited by examiner

*Primary Examiner* — Mischita L Henson
(74) *Attorney, Agent, or Firm* — Buckert Patent & Trademark Law Firm PC; John F. Buckert

(57) ABSTRACT

A system for accurately determining an amount of electrical current flowing through a Hall effect current sensor is provided. The system includes a microcontroller that determines a smoothed electrical current offset value based on an average measured apparent electrical current value, an electrical current offset smoothing coefficient, a prior smoothed electrical current offset value, and a prior electrical current offset trend value. The microcontroller determines an electrical current offset trend value associated with the Hall effect current sensor based on the smoothed electrical current offset value, an electrical current offset trend smoothing coefficient, a prior smoothed electrical current offset value, and the prior electrical current offset trend value.

7 Claims, 4 Drawing Sheets

SYSTEM FOR ACCURATELY DETERMINING AN AMOUNT OF ELECTRICAL CURRENT FLOWING THROUGH A HALL EFFECT CURRENT SENSOR

BACKGROUND

The inventor herein has recognized a need for an improved system for accurately determining the amount of electrical current flowing through a Hall effect current sensor. In particular, Hall effect current sensors typically report a value of current that is offset from a true zero value when no current is flowing. In addition, this offset adds or subtracts, depending on polarity, from the actual magnitude of the electrical current reported when electrical current is flowing through the Hall effect current sensor.

The current sensor offset value of a Hall effect current sensor has two components. The first component is a relatively constant electrical offset that is an artifact of the manufacture of the sensor and the mounting of the sensor on the circuit board. The second component is a magnetic offset that is an artifact of the previous history of flowing electrical current. It changes with every change in electrical current polarity and magnitude.

The inventor has recognized that a Hall effect current sensor's offset, when determined solely by identifying the apparent electrical current magnitude at system startup, when electrical current is known to be zero, and subtracting that offset value from the value indicated by the Hall effect current sensor, is not sufficient to accurately determine the true magnitude of electrical current flowing through the sensor. This is due to the fact that such a value typically includes a value representing the sensor's electrical offset added to a value representing that sensor's magnetic offset. The improved system removes the magnetic offset component by smoothing the successive values of the apparent electrical current magnitude over a history of apparent current magnitude values all taken at system startup when no electrical current is flowing through the Hall effect current sensor.

Referring to FIG. 2, a flux density versus magnetizing force curve 200 is illustrated. By empirical evidence, the balanced polarity nature of the magnetic offset (as shown by this symmetric-about-zero relationship between magnetizing force and flux density), and reasoning about the use/application of the Hall effect sensor, an assumption is made that the act of smoothing over a history of offset determinations will result in the magnetic component values balancing out to near zero. Therefore, the remaining smoothed offset can be considered to be the true constant electrical offset of the Hall effect current sensor.

SUMMARY

A system for accurately determining the amount of electrical current flowing through a Hall effect current sensor is provided. The system includes a microcontroller operably coupled to the Hall effect current sensor. The microcontroller determines an average measured apparent electrical current value based on an electrical current output signal from the Hall effect current sensor during a vehicle startup time before an electrical current is flowing through the sensor. The microcontroller determines a smoothed electrical current offset value based on the averaged set of measured apparent electrical current values, an electrical current offset smoothing coefficient, a prior smoothed electrical current offset value, and a prior electrical current offset trend value. The microcontroller determines an electrical current offset trend value associated with the Hall effect current sensor based on the smoothed electrical current offset value, an electrical current offset trend smoothing coefficient, a prior smoothed electrical current offset value, and the prior electrical current offset trend value.

DETAILED DESCRIPTION

Figure 1:
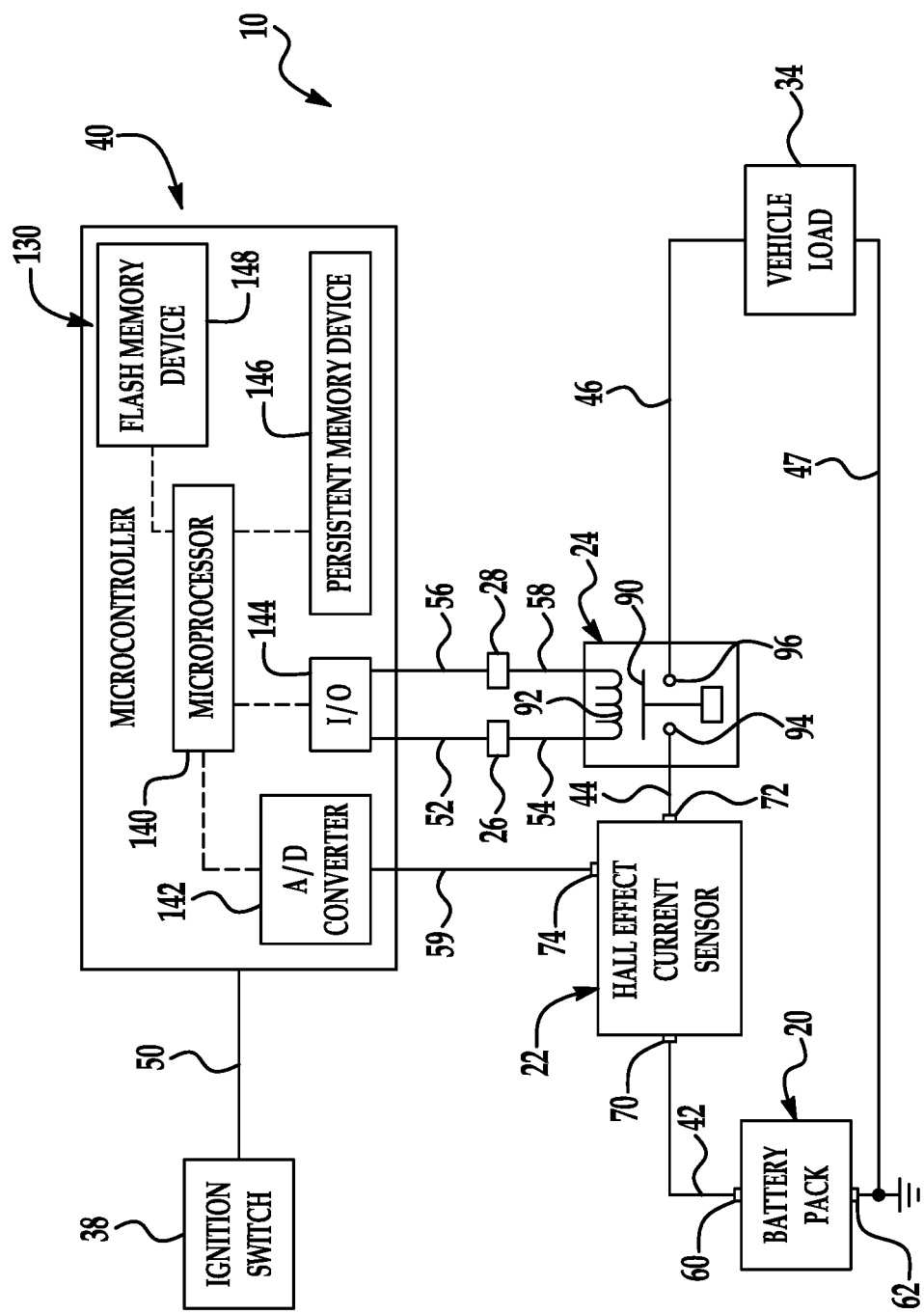
FIG. 1 is a schematic of a vehicle having a system for accurately determining an amount of electrical current flowing through a Hall effect current sensor in accordance with an exemplary embodiment.
Figure 2:
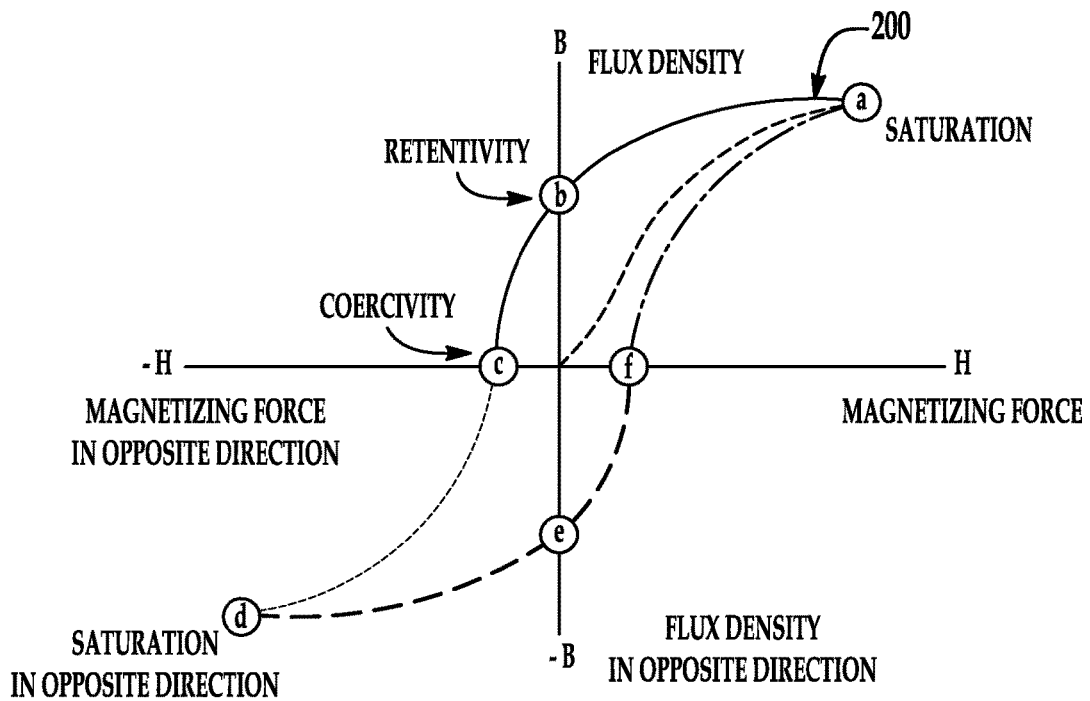
FIG. 2 is a schematic of a flux density versus magnetizing force curve.

Referring to FIG. 1, a vehicle 10 is provided. The vehicle 10 includes a battery pack 20, a Hall effect current sensor 22, a contactor 24, a voltage driver 26, a voltage driver 28, a vehicle load 34, an ignition switch 38, a system 40 in accordance with an exemplary embodiment, and electrical lines 42, 44, 46, 47, 50, 52, 54, 56, 58, 59.

Figure 3:
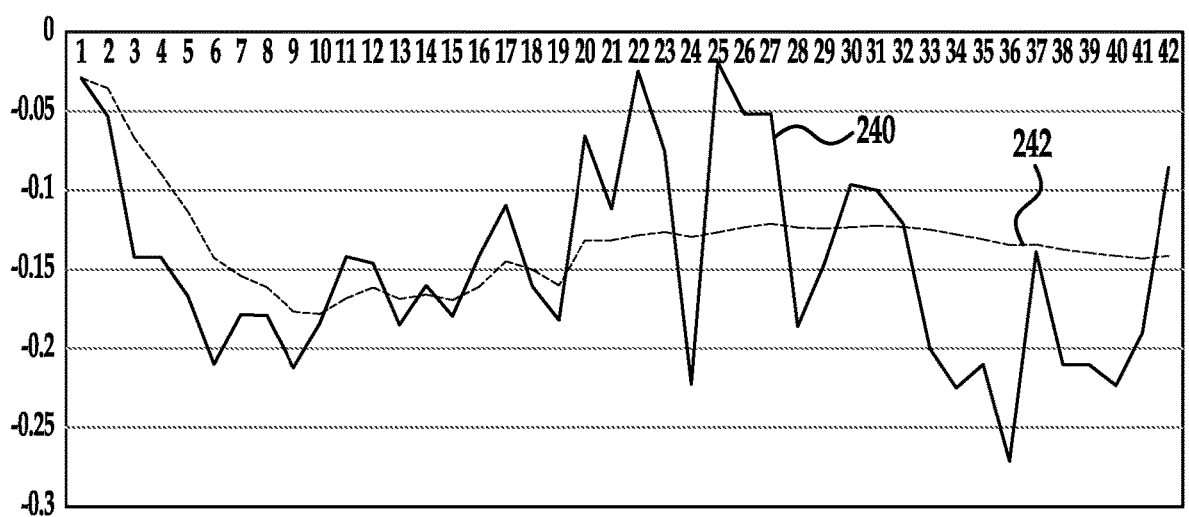
FIG. 3 is a plot of forty-two consecutive averaged startup raw current sensor values (trace 240) when contactors are open and current is expected to be zero and also plot of the smoothed result of these raw values (trace 242) over the history of the preceding raw values up to that point.

Referring to FIG. 3, a plot of raw electrical current sensor values (trace 240) and calculated smoothed electrical current offset values (trace 242) are illustrated. An advantage of the system 40 is that the system accurately determines an amount of electrical current flowing through the Hall effect current sensor 22 by correctly identifying the expected constant value of electrical current offset by removing the always varying magnetic current offset component from the value of current indicated by the Hall effect current sensor 22 during vehicle startup when a contactor 24 has an open operational state and no current is flowing. The system 40 implements this methodology by smoothing the new values of current sensor output at each vehicle startup over a history of current sensor outputs all taken at vehicle startup when no electrical current is flowing through the Hall effect current sensor 22. These characteristics can be seen in the following plots from real collected data. The trace 240 shows forty-two individual current sensor values provided by the Hall effect current sensor 22 at vehicle startup when the contactor 24 has the open operational state and there is no current flowing through the sensor 22. The values range from approximately −0.03 amps to −0.27 amps. Each of these 42 values are comprised of a non-changing electrical offset component and an always changing magnetic offset component. The trace 242 shows the result of smoothing of the individual values and represents the best estimate of the value of the electrical current offset.

For purposes of understanding, a few terms utilized herein will be explained.

The term "node" is a region or a location in an electrical circuit.

The terms "voltage value" means a value that is equal to the magnitude of a voltage.

The term "open operational state" means a state in which an electrical current does not flow therethrough.

The term "A/D converter" means an analog-to-digital voltage converter.

The battery pack 20 includes a positive terminal 60 and a negative terminal 62. In an exemplary embodiment, the battery pack 20 provides substantially 48 Vdc between the positive terminal 60 and the negative terminal 62. The positive terminal 60 is electrically coupled to a terminal 70 of the Hall effect current sensor 22 utilizing the electrical line 42. The negative terminal 62 is electrically coupled to electrical ground.

The Hall effect current sensor 22 is provided to measure an electrical current flowing from the battery pack 20 to the vehicle load 34 when the contactor 24 has a closed operational state. The Hall effect current sensor 22 includes terminals 70, 72, 74. As discussed above, the terminal 70 is electrically coupled to the terminal 60 of the battery pack 20 utilizing the electrical line 42. The terminal 72 is electrically coupled to the node 94 of the contactor 24 utilizing the electrical line 44. Further, the terminal 76 is electrically coupled to the A/D converter 142 utilizing the electrical line 59. The Hall effect current sensor 22 measures an electrical current flowing between the terminals 70, 72 and outputs an electrical voltage output signal (indicative of the magnitude of the electrical current flowing through the sensor) from the terminal 74 that is received by the A/D converter 142. The A/D converter 142 converts the measured electrical voltage values, which are proportional to the magnitude of the current flowing through the Hall effect sensor 22, in analog form from 0 to an exemplary 5 volts into a digital representation of the voltage that is then read by the microcontroller 130. The digital representation of the 0 to 5 volt voltage range is mapped across the number of bits of digital representation provided by the A/D converter 142. In an exemplary embodiment the number of bits of digital representation is 12, allowing for a range of values from 0 through 4095. The microprocessor 140 then maps these values to the range of actual current values of current flowing through the Hall effect sensor 22. In an exemplary embodiment, a range of current values from −60 Amps to +60 Amps is mapped to 0 representing −60 Amps 4095 representing +60 Amps and each value between 0 and 4095 representing an increment of 4096/120 greater than the previous value.

The contactor 24 has a contact 90, a contactor coil 92, a node 94, and a node 96. As discussed above, the node 94 is electrically coupled to the terminal 72 of the Hall effect current sensor 22 utilizing the electrical line 44. Further, the node 96 is electrically coupled to the vehicle load 34 utilizing electrical line 46. The vehicle load 34 is further electrically coupled to the electrical ground utilizing the electrical line 47.

When the microcontroller 130 commands the digital Input/Output device 144 to generate first and second control signals that are received by the voltage drivers 26, 28, respectively, the contactor coil 92 is energized which transitions the contact 90 to a closed operational state. Alternately, when the microcontroller 130 commands the digital I/O device 144 to generate third and fourth control signals that are received by the voltage driver 26 and the voltage driver 28, respectively, the contactor coil 92 is de-energized which transitions the contact 90 to an open operational state. In an exemplary embodiment, the third and fourth control signals can each be a ground voltage level.

The voltage driver 26 and the voltage driver 28 are provided to energize or de-energize the contactor coil 92. The voltage driver 26 is electrically coupled to the digital Input/Output device 144 of the microcontroller 130 utilizing the electrical line 52. The voltage driver 26 is further electrically coupled to a first end of the contactor coil 92 utilizing the electrical line 54. The voltage driver 26 energizes the contactor coil 92, when the voltage driver 26 receives a control signal from the microcontroller 130.

The voltage driver 28 is electrically coupled to the digital Input/Output device 144 of the microcontroller 130 utilizing the electrical line 56. The voltage driver 28 is further electrically coupled to a second end of the contactor coil 92 utilizing the electrical line 58. The voltage driver 28 is configured to conduct an electrical current through to the electrical ground for energizing the contactor coil 92, when the voltage driver 28 receives a control signal from the microcontroller 130.

The vehicle load 34 is electrically coupled to the node 96 of the contactor 24. When the contactor 24 has a closed operational state, a positive voltage from the battery pack 20 is applied to the vehicle load 34 for energizing the vehicle load 34. When the contactor 24 has an open operational state, the positive voltage from the battery pack 20 is removed from the vehicle load 34 which de-energizes the vehicle load 34.

The ignition switch 38 is electrically coupled to the microcontroller 130 utilizing the electrical line 50. The ignition switch 38 has either a closed operational state or an open operational state.

The system 40 is provided to accurately determine the amount of electrical current flowing through the Hall effect current sensor 22 in accordance with an exemplary embodiment. The system 40 includes the microcontroller 130 having the microprocessor 140, the A/D converter 142, the digital Input/Output device 144, and a persistent memory device 146. The microprocessor 140 is operably coupled to the A/D converter 142, the digital Input/Output device 144, the flash memory device 148, and the persistent memory device 146. The persistent memory device 146 stores data values utilized by the microprocessor 140 and the flash memory device 148 stores the software application utilized by the microprocessor.

The digital Input/Output device 144 is electrically coupled to the voltage drivers 26, 28. The digital Input/Output device 144 outputs control signals that are received by the voltage drivers 26, 28 for controlling an operational state of the contactor 24.

The A/D converter 142 is electrically coupled to the terminal 74 of the Hall effect current sensor 22 utilizing the electrical line 59. The A/D converter 142 converts an analog voltage value received from the Hall effect current sensor 22 that represents the magnitude of the current flowing through the sensor and converts it to a digital representation that is received by the microprocessor 140.

The persistent memory device 130 is provided to permanently store values from one power on cycle to the next, including the results of the smoothing algorithm performed by the microprocessor 140 which needs to be available as an input to the same smoothing algorithm during the next application of the smoothing algorithm at the start of the next power on cycle.

Figure 4:
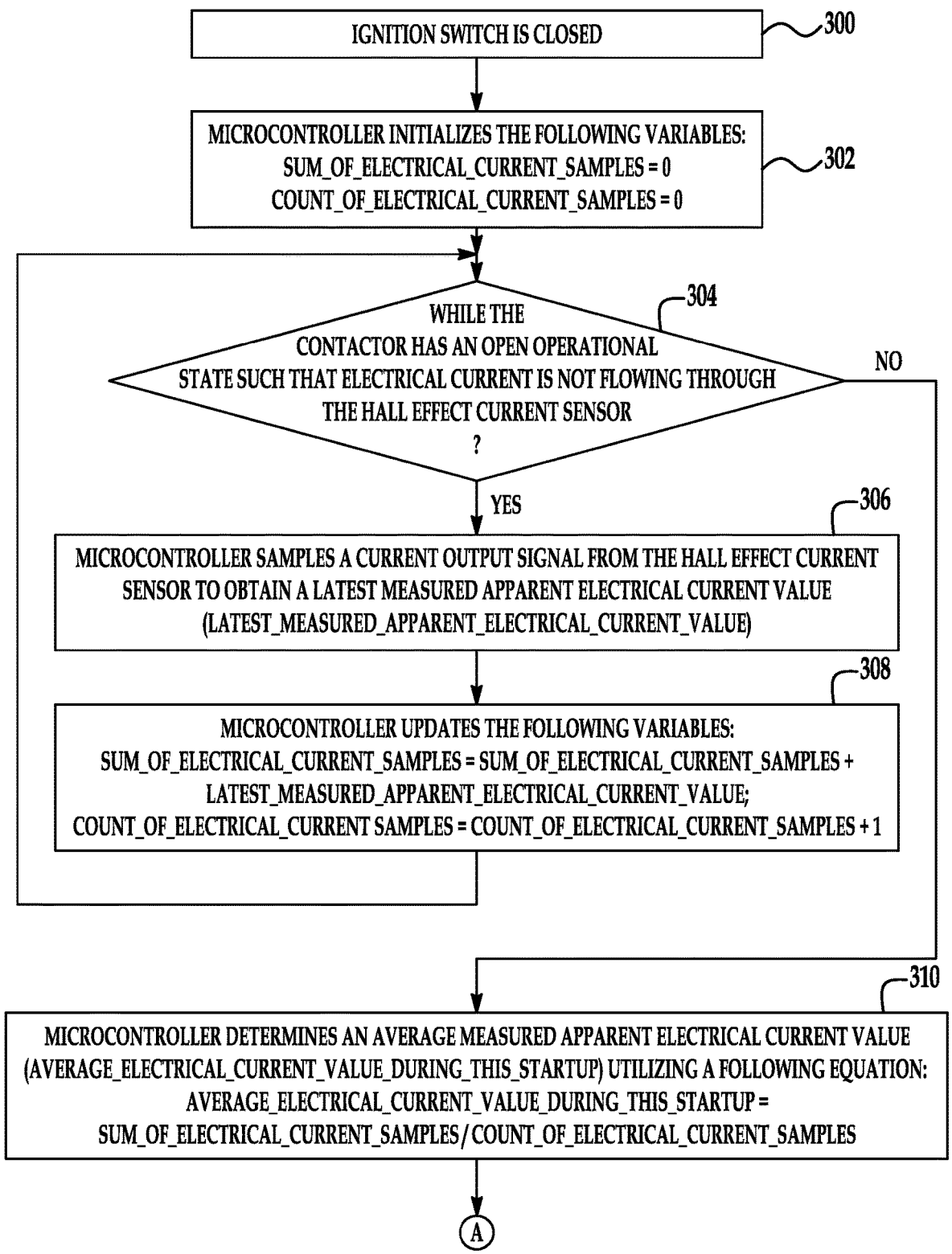
FIGS. 4-5 are flowcharts of a method for accurately determining an amount of electrical current flowing through the Hall effect current sensor utilizing the system of FIG. 1.
Figure 5:
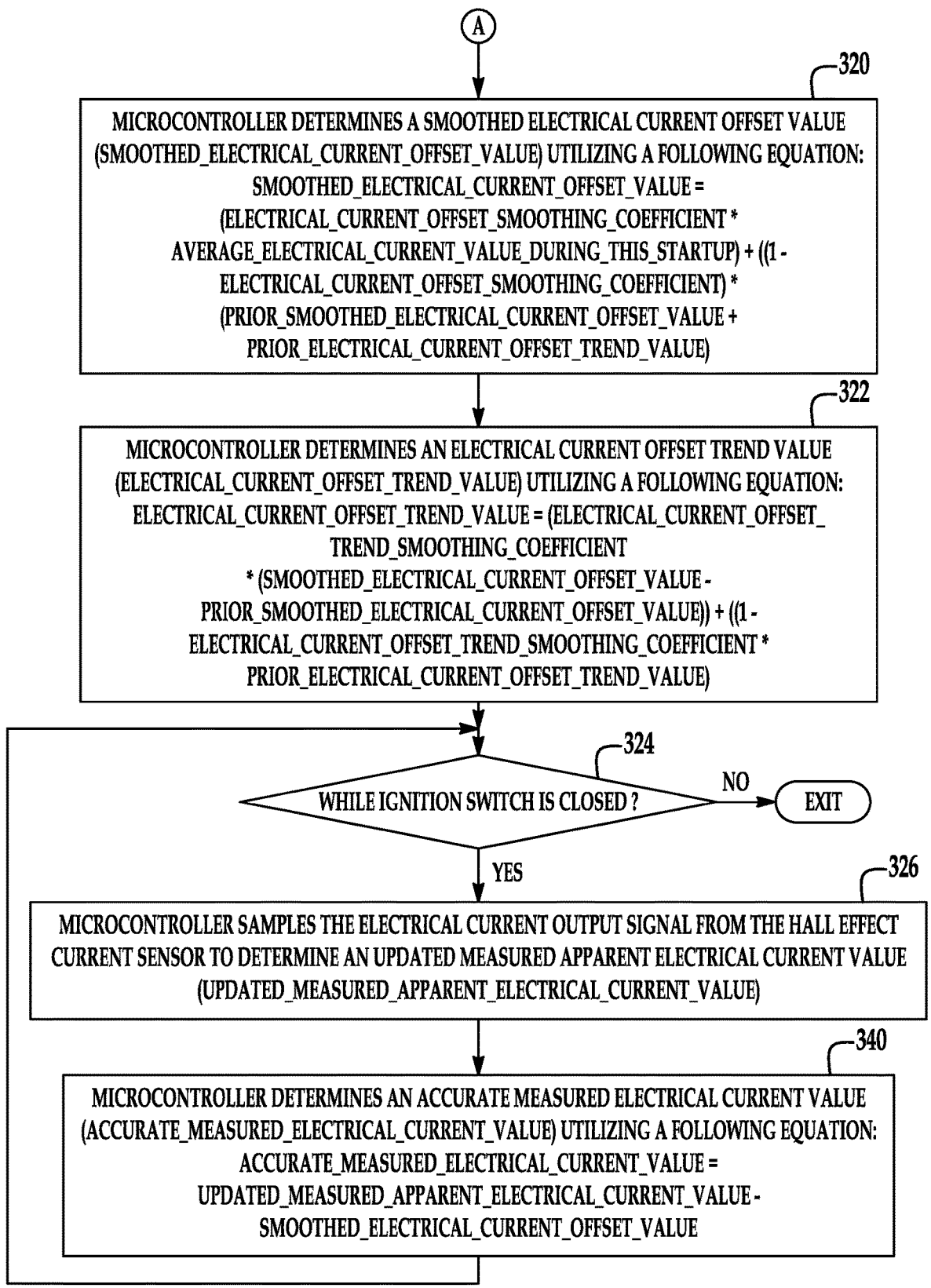

Referring to FIGS. 1 and 4-5, a flowchart of a method for accurately determining an amount of electrical current flowing through the Hall effect current sensor 22 utilizing the system 40 will now be explained.

At step 300, the ignition switch 38 is closed. After step 300, the method advances to step 302.

At step 302, the microcontroller 130 initializes the following variables:

sum_of_electrical_current_samples=0;
count_of_electrical_current_samples=0. After step 302, the method advances to step 304.

At step 304, the microcontroller 130 iteratively performs the steps 306, 308 while the contactor 24 has an open operational state such that electrical current is not flowing through a Hall effect current sensor 22. If the value of step 304 equals "yes" (indicating the contactor 24 has the open operational state), the microcontroller 130 performs the steps 306, 308. Otherwise, the method advances to step 310.

At step 306, the microcontroller 130 samples a current output signal from the Hall effect current sensor 22 to obtain a latest measured apparent electrical current value (latest_measured_apparent_electrical_current_value). After step 306, the method advances to step 308.

At step 308, the microcontroller 130 updates the following variables:
sum_of_electrical_current_samples=sum_of_electrical_current_samples+latest_measured_apparent_electrical_current_value;
count_of_electrical_current_samples=count_of_electrical_current_samples+1. After step 308, the method returns to step 304.

Referring again to step 304, if the value of step 304 equals "no", the method advances to step 310.

At step 310, the microcontroller 130 determines an average measured apparent electrical current value (average_electrical_current_value_during_this_startup) utilizing a following equation: average_electrical_current_value_during_this_startup=sum_of_electrical_current_samples/count_of_electrical_current_samples. After step 310, the method advances to step 320.

At step 320, the microcontroller 130 determines a smoothed electrical current offset value (smoothed_electrical_current_offset_value) utilizing a following equation: smoothed_electrical_current_offset_value=(electrical_current_offset_smoothing_coefficient*average_electrical_current_value_during_this_startup)+((1+electrical_current_offset_smoothing_coefficient)*(prior_smoothed_electrical_current_offset_value+prior_electrical_current_offset_trend_value). After step 320, the method advances to step 322.

At step 322, the microcontroller 130 determines an electrical current offset trend value (electrical_current_offset_trend_value) utilizing a following equation: electrical_current_offset_trend_value=(electrical_current_offset_trend_smoothing_coefficient*(smoothed_electrical_current_offset_value−prior_smoothed_electrical_current_offset_value))+((1−electrical_current_offset_trend_smoothing_coefficient)*prior_electrical_current_offset_trend_value). The electrical_current_offset_smoothing_coefficient has a value in a range of 0-1. Also, the electrical_current_offset_trend_smoothing_coefficient has a value in a range of 0-1. After step 322, the method advances to step 324.

At step 324, the microcontroller 130 iteratively performs the steps 326, 340 while the ignition switch 38 is closed.

At step 326, the microcontroller 130 samples the electrical current output signal from the Hall effect current sensor 22 to determine an updated measured apparent electrical current value (updated_measured_apparent_electrical_current_value). After step 326, the method advances to step 340.

At step 340, the microcontroller 130 determines an accurate measured electrical current value (accurate_measured_electrical_current_value) utilizing the following equation: accurate_measured_electrical_current_value=updated_measured_apparent_electrical_current_value−smoothed_electrical_current_offset_value. After step 340, the method returns to the step 324.

The system described herein provides a substantial advantage over other systems. In particular, the system described herein accurately determines an amount of electrical current flowing through the Hall effect current sensor by removing the magnetic offset bias component from the electrical current offset value by smoothing the successive startup values of the current sensor value that is available at startup before the contactors are closed and current is flowing over a history of startup current sensor values all taken when no electrical current is flowing through the Hall effect current sensor.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. A system for accurately determining an amount of electrical current flowing through a Hall effect current sensor, comprising:
the Hall effect current sensor electrically coupled in series with a battery pack and a contactor, the Hall effect current sensor generating an electrical current output signal;
an electrical line electrically coupled to and between the Hall effect current sensor and a microcontroller;
the microcontroller receiving the electrical current output signal from the Hall effect current sensor utilizing the electrical line, the microcontroller determining an average measured apparent electrical current value based on the electrical current output signal from the Hall effect current sensor, before an electrical current is flowing through the Hall effect current sensor;
the microcontroller determining a smoothed electrical current offset value based on the average measured apparent electrical current value, an electrical current offset smoothing coefficient, a prior smoothed electrical current offset value, and a prior electrical current offset trend value; and
the microcontroller determining an electrical current offset trend value associated with the Hall effect current sensor based on the smoothed electrical current offset value, an electrical current offset trend smoothing coefficient, a prior smoothed electrical current offset value, and the prior electrical current offset trend value.

2. The system of claim 1, wherein:
the microcontroller determining an updated measured apparent electrical current value based on the electrical current output signal from the Hall effect current sensor, when the electrical current is flowing through the Hall effect current sensor; and
the microcontroller determining an accurate measured electrical current value by subtracting the smoothed electrical current offset value from the updated measured apparent electrical current value.

3. The system of claim 1, wherein:
the microcontroller sampling the electrical current output signal from the Hall effect current sensor while a contactor has an open operational state to obtain a plurality of measured apparent electrical current values and before the electrical current is flowing through the Hall effect current sensor; and
the microcontroller determining the average measured apparent electrical current value based on the plurality of measured apparent electrical current values.

4. The system of claim 1, wherein the smoothed electrical current offset value is calculated utilizing a following equation:

smoothed electrical current offset value=(electrical current offset smoothing coefficient*average measured apparent electrical current value)+((1−electrical current offset smoothing coefficient)*(prior smoothed electrical current offset value+prior electrical current offset trend value).

5. The system of claim 1, wherein the electrical current offset trend value is calculated utilizing a following equation:

electrical current offset trend value=(electrical current offset trend smoothing coefficient*(smoothed electrical current offset value−prior smoothed electrical current offset value))+((1−electrical current offset trend smoothing coefficient)*prior electrical current offset trend value).

6. The system of claim 1, wherein the electrical current offset smoothing coefficient has a value in a range of 0-1.

7. The system of claim 1, wherein the electrical current offset trend smoothing coefficient has a value in a range of 0-1.

* * * * *